United States Patent [19]
Ratner

[11] Patent Number: 5,654,900
[45] Date of Patent: Aug. 5, 1997

[54] METHOD OF AND APPARATUS FOR OPTIMIZATION OF STRUCTURES

[76] Inventor: Leah Ratner, 820 W. Belle Plaine #804, Chicago, Ill. 60613

[21] Appl. No.: 264,106

[22] Filed: Apr. 22, 1994

Related U.S. Application Data

[63] Continuation of Ser. No. 639,359, Jan. 10, 1991, abandoned.
[51] Int. Cl.$^6$ .............................. G06F 17/50; G06F 17/10
[52] U.S. Cl. ............................................................ 364/512
[58] Field of Search ..................... 73/760, 852; 364/512, 364/550

[56] References Cited

U.S. PATENT DOCUMENTS

| | | | |
|---|---|---|---|
| 3,693,413 | 9/1972 | Boynton | 73/65.08 |
| 4,213,349 | 7/1980 | Miura | 73/847 |
| 4,788,868 | 12/1988 | Wilk | 73/760 |
| 4,884,445 | 12/1989 | Sadoff et al. | 73/379.02 |
| 4,884,453 | 12/1989 | Hoffmann et al. | 73/776 |
| 4,884,455 | 12/1989 | Vinegar et al. | 73/798 |
| 5,528,942 | 6/1996 | Baratta | 73/856 |
| 5,574,658 | 11/1996 | Ito | 364/512 |

*Primary Examiner*—Edward R. Cosimano

[57] ABSTRACT

The invention is of a basic nature, the entire technical disclosure is new in the art of design. The new method is based on a new concept of strength and elastic stability. Classical mechanics views a body to be formed of small units of material. Such fundamental characteristic of a body as an elastic limit is identified with limit of material unit. It is scientific conclusion supported with facts that every structure has its own limit which, in general, is different from the limit of material. New basic equation of elastic deformation establishes deformation—elastic force—geometrical stiffness relations. Geometrical stiffness characterizes the resistance to deformation, based on geometry of the whole body. New method suggests a different approach to using mathematical equations and procedures. In order to obtain valid and verifiable inferences from an equation, attention should be paid to physical meaning of the variables. The new equation of elastic stability establishes relation between elastic force and geometrical stiffness in the interval of rapid change in deformation. The invention presents the new non-destructive method of design. Major problems in design process were formulated in 17th century, and yet have not been solved. And, although, the problems are the same, their economical and social impact in technological society of the 20th century is quite different.

3 Claims, 2 Drawing Sheets

METHOD OF AND APPARATUS FOR OPTIMIZATION OF STRUCTURES

This is continuation of Ser. No. 07/639,359 filed Jan. 10, 1991 now abandoned.

BACKGROUND OF THE INVENTION

1. Field of the Invention

The present invention relates to the art of design load bearing design members and, more particularly, to the method of using data of deformation and geometrical stiffness for calculating the elastic limit and corresponding optimal dimensions of a member.

The present invention also relates to nondestructive testing resistance of a member to elastic deformation and, more particularly, to the testing geometrical stiffness of a member.

The invention also relates to the testing mechanical properties of the structures and materials.

2. Description of the Prior Art

The prior art of design is based on well known theories of strength such as maximum-stress theory, maximum-strain theory, maximum strain-energy theory. A physical concept underlying these theories is that material limits the application of Hooke's Law of elasticity, $\sigma=E\epsilon(1)$. According to the most common maximum-stress theory member is considered to be reliable if maximum stress in the member is less than proportional limit of the material.

"Hooke's Law. It has been found by experiment that a body acted on by external forces will deform in proportion to the stress developed as long as the unit stress does not exceed a certain value which varies for the different materials. This value is the proportional limit." (Eshbach, Handbook of Engineering Fundamentals, 3d Ed.,p. 489)

Then, the art of calculating dimensions of a member follows the theory. Stresses in the member can be obtained analytically or by measurement. Test of material using the standard specimen gives mechanical properties of the material such as proportional limit, elastic limit, ultimate strength, modulus of elasticity of material. Maximum stress in the member then compared with proportional limit of the material for calculating the cross-sectional characteristics or correcting them. For example, in case of tension, $\sigma=N/A \leq [\sigma_p]$ (2), $A \geq N/[\sigma_p]$ (3). In the case of bending, $\sigma_{max}=M_{max}/Z \leq [\sigma_p]$ (4), $Z \geq M_{max}/[\sigma_p]$ (5)

Presently, there is no universality in the theories of strength. In contrary to the general strength theories the theory of buckling is based on assumption that critical buckling load or stress does not depend on the critical characteristics of the material, but depends on geometry and modulus of elasticity of material only.

"Equation is known as Euler's column formula indicates that the critical buckling load is not a function of the strength of the material (yield and ultimate strengths are not envolved) but only of elastic modulus and geometry." (Engineering Design, by Faupel and Fisher, 2nd Ed.,p. 568)

The prior art of design has great achievements. However, it has major flaws as well. The main disadvantage of the prior art is that strength theories do not corroborate well with the physical evidence. Thus, the strength theories contradict to overwhelming evidence that critical for a structure load or stress depends on geometry of design and modulus elasticity of material and not a function of the material strength.

It is true for the buckling and all general cases of deformation as well. Confirmation to this point of view can be found in the tests of materials and structures.

"Fundamental data obtained in a test on material are affected by the method of testing and the size and shape of the specimen. To eliminate variations in results due to these causes, standards have been adapted by ASTM, ASME and various associations and manufactures." (Eshbach, Handbook of Engineering Fundamentals, 3d ED.,p. 566)

It is obvious that eliminate differences in the size, shape, method of loading is impossible in the structures other than specimen. Different structures made of the same material have different limits. The standards and tests of the structures of some but insufficient help. Common physical foundation and the equations describing relations between critical for the design load and the geometry of the design must be developed.

The buckling empirical formulas developed for different practical cases are not applicable for general cases of bending, tension, torsion. In fact, these formulas are not very reliable even for cases of buckling. The buckling formulas are developed with the assumption that failure of the columns, for example, occurs due to the sidewise bending.

"This assumption is not true for very short columns, nor it is true for columns of medium length such as are usually needed in practice. There is no exact formula which gives the strength of a column of any length under an axial load." (Eshbach, Handbook of Engineering Fundamentals, 3d Ed.,p. 529)

The theories of strength remained hypothetical for centuries. And design technic became more and more complicated due to uncertainty in the art of design.

"Here the continuing trend towards lighter and thinner structures associated with the use of high strength material is bringing problems of elastic stability increasingly to the fore. This has long been the case in aerospace field, but it is now rapidly extending to ships and to high-rise buildings. And as designs become even more efficient the engineer will be faced with even more instabilities demanding the sophisticated treatments." (A General Theory of Elastic Stability, by J. M. T. Thompson and G. W. Hunt, 1971 London,p. 48).

Examplary teachings of prior art of design and assisting devices can be found in the textbooks, handbooks, American Standards, U.S. Pat. Nos. 4,788,868; 4,884,453; 4,884,445; 4,884,455, also in the article 'Deflections Indicate Design Similarity' by L. Ratner, 'Machine Design' of May 8, 1986.

The present invention in the art of design is based on a new and different physical concept of strength. According to this concept each structure has an individual proportional and elastic limits which, in general, are different from the limits of the material. The limit of a structure depends on the resistance of a structure to elastic deformation. Physical characteristic describing this resistance is called 'stiffness'. Stiffness depends on elasticity of the material(E), geometry of the design and boundary conditions.

A part of the stiffness which is a function of the size, shape, specific design features and boundary condition is singled out and described as a new important characteristic of a structure called 'geometrical stiffness'. Then, general equation of elastic deformation can be written as following. Total elastic deformation is proportional to the distributed in the structure force and inversely proportional to the geometrical stiffness and modulus elasticity of material, $D=F/ER$ (6).

Thus, in case of tension, $e=N/ER$ (7) where $R=KA/L$ (8). In case of bending total angular deformation, $\theta=M/ER$ (9) where geometrical stiffness $R=KI/L$ (10). Geometrical stiffness in the equations of elastic deformation is presented as a physical entity.

The equations of deformation in the prior art are different and the difference is not formal but of practical importance. Presently, in case of tension, $e=NL/EA$ (11.). In case of bending the general equation of elastic line, $M=\pm EI*dY^2/dx^2$. From the general equation the equations for different specific cases are developed. For example, for the simple beam with concentrated load at the center, $Y_{max}=PL^3/48EI$ (12), $\theta_{max}=PL^2/16EI$ (13).

For the purpose of optimization of dimensions it is necessary to know how geometry, in particular size, affects deformation. The equation which should show such effect is differential equation derived from the equation of elastic deformation. Scientific logic suggests that if an equation represents the relations between components correctly then derivative differential equation will be also correct. However, it appears that differential equations derived from existing equations of deformation are incorrect. For example, $d\theta/dI=-PL^2/16EI^2$, does not describe the rate of change of deformation depending on change of moment of inertia of cross-section correctly. The equations of elastic deformation in the prior art are unsuitable for the purpose of optimization. The new equations of deformation are different. The main components in the equation are distributed in a structure forces, geometrical stiffness, total deformation. Though, each of these components can be presented as a function in the equation of deformation said components presented as the physical entities. This holistic approach differs from existing disintegrated approach when the equation of deformation became the mixture of elements belonging to the components of different physical origin. Thus, in the equation $Y_{max}=PL^3/48EI$ one of L-s belongs to the bending moment, other to the geometrical characteristic, yet another to the resulting deformation. Such attitude of neglecting physical meaning of components lead to the flaws in representation of relations and in results. New equations describe elastic relations more accurately. Differential equations derived from them are also correct. On example of a beam deformation—geometrical stiffness relation is presented graphically in diagram $\theta$ vs. R (FIG. 1). The diagram shows rapid increase of deformation in the interval proportional-elastic limit. Beyond this limit, an insignificant decrease in stiffness results in failure of elastic behavior. Likewise, increasing geometrical stiffness above the proportional limit does not improve elastic stability. The point $R_a$ on diagram shows position of an actual geometrical stiffness of tested structure. The point $R_o$ shows position of optimal geometrical stiffness for given force and material.

The rate of change of deformation due to geometrical stiffness is a reliable criterion for design optimization. The proportional and elastic limits are characterized with the rate of change of deformation. In the interval proportional-elastic limit the rate can be anticipated from $\tan \alpha=1.0$ ($\alpha=45°$) to $\tan \alpha=3.7$ ($\alpha=75°$).

The rate of change of deformation can be described with differential equation derived from the equation of elastic deformation, $dD/dR=-F/ER^2$ (14). The relations within limits is $F/ER^2=C_s$ (15) where $C_s=\tan \alpha$ is coefficient of elastic stability. The equation (15) is a foundation of elastic design. Thus, in case of bending, $d\theta/dR=M/ER_o^2=C_s$ (16). Optimal geometrical stiffness $R_o=(M/EC_s)^{0.5}$ (17).

Geometrical stiffness of a beam is a function of moment of inertia of cross-section, length, specifics of a beam design and boundary conditions, $R=KI/L$ (10) where 'K' is a coefficient which counts effect of specifics and boundary conditions on geometrical stiffness.

Physical meaning of geometrical stiffness is clear from the equation. The greater is moment of inertia, the greater is geometrical stiffness. The greater is length, the less is geometrical stiffness. Different beams may have the same stiffness if they have the same ratio moment of inertia to the length, $R=KI_1/L_1=KI_2/L_2$.

Absolutely different structures may have the same geometrical stiffness, $R=M/E\theta$. Considering geometrical stiffness as an entity, as a new property of a structure allows to establish standards of geometrical stiffness for the purpose of measurement. Note, that mode of deformation is considered in defining stiffness for bending, tension, torsion.

In order to correct geometrical stiffness of a beam, for example, one can change moment of inertia of cross-section. Here, $R_o/R_a=I_o/I_a$. Optimal moment of inertia, $I_o=I_aR_o/R_a$ (18). The problem of calculating optimal moment of inertia with equation (10) is in the fact that coefficient 'K' in the equation which counts specifics of design and boundary conditions initially can be obtained only experimentally. The series of similar structures have common coefficient 'K'.

In some cases limit of elasticity of material can present limitation for a structure. Therefore, maximum stress in the structure of optimal dimensions must be checked against stress allowable by the material $\sigma_{max}=M_{max}/Z_o \leq |\sigma_p|$ (19).

The method of optimization of load bearing design members which is further described on examplary teachings is an essential general method. The method can be used for optimization of any type of design of any complexity and of any material. The method is directed to optimization series of similar structures by testing one representative. It is very economical method. The new method will contribute to the safety and reliability of the structures and give savings on materials, labor, time.

The material presented makes it clear fundamental difference between the prior art of design and a new art and advantages of the new art. The prior art did not realize an existance the individual limit of a structure. It makes the methods of the prior art deficient. Further, in order to choose proper dimensions it is necessary to know how geometry affects behaviour of a structure. The rate of change of deformation is an indicator of elastic behavior. There is no knowledge of that in the prior art. Fixed criteria of limiting stress and limiting deformation in the prior art do not describe elastic behavior and they are unsuitable for the purpose of optimization.

There is no equation which describes rate of change of deformation depending on geometry in the prior art. Existing in the prior art equation of elastic: deformation cannot be used for that purpose for it does not describe relations deformation-geometry correctly.

The new property of a structure, e.g., geometrical stiffness is introduced in the art of design in order to reflect an effect of geometry on elastic behaviour. A new equation of elastic deformation describes deformation-force-geometrical stiffness relations. The derived equation describes rate of change of deformation depending on geometrical stiffness. Both equations essential for scientific design process are missing in the prior art.

An equation describing geometrical stiffness of a structure makes it possible to compare similar structures of different dimensions. It allows economical optimization series of similar structures after testing stiffness of a representative structure.

The new art challenges prior art. It makes it possible to compare structures, to predict behavior of structures, to make design process scientific rather than empirical.

Major differences between the prior art of design and new art are summarized in the TABLE OF COMPARATIVE ANALYSIS OF PRIOR ART AND THE NEW METHOD.

| TABLE OF COMPARATIVE ANALYSIS OF PRIOR ART AND THE NEW METHOD | |
| --- | --- |
| Prior Art | New Method |
| 1. Hooke's Law | |
| Strength of a structure is identified with strength of material, $\sigma = E \epsilon = [\sigma_p]$. | Each structure has an individual elastic limit which is different from the limit of material and need to be considered in design process. |
| 2. Equations of elastic deformation | |
| Tension: $e = NL/EA$<br>Bending: $\theta = PL/K'EI$<br>Torsion: $\phi = TL/GJ$ | $e = N/ER$ where $R = KA/L$<br>$\theta = M/ER$ where $R = KI/L$<br>$\phi = T/GR$ where $R = KJ/L$<br>In the equations of deformation 'R' is a single characteristic called geometrical stiffness. |
| 3. Equations of elastic stability | |
| The equations describing how geometry of a structure affects deformation are not developed. | $N/ER_o^2 = C_s$; $M/ER_o^2 = C_s$; $T/GR_o^2 = C_s$ where 'Cs' is a coefficient of elastic stability. Coefficient describes rate of change of deformation in the interval proportional-elastic limit. |
| 4. Main criterion for design | |
| Certain characteristic of a material such as proportional limit is criterion of design.<br>$\sigma = N/A = [\sigma_p]$, $A = N/[\sigma_p]$<br>$\sigma = M/Z = [\sigma_p]$, $Z = M/[\sigma_p]$ | Certain rate of change of deformation is a criterion of design. It is true within elastic limit of material.<br>$R_o = (N/EC_s)0.5$, $R_o = KA_o/L$<br>$R_o = (M/EC_s)0.5$, $R_o = KI_o/L$. |

NOTATIONS $\sigma$=unit stress
$\sigma_{max}$=maximum stress
$\epsilon$=unit deformation
E=modulus of elasticity of material
G=modulus of elasticity in shear
N=axial force
A=cross-sectional area
L=length
I=moment of inertia of cross-section
$I_o$=optimal moment of inertia
$I_a$=actual moment of inertia
Z=section modulus
$Z_o$=optimal section modulus
J=polar moment of inertia
M=bending moment
$M_{max}$=maximum bending moment
T=twisting moment
e=total deformation in tension or compression
$\theta$=total angular deformation in bending
$Y_{max}$=maximum vertical deflection
$\gamma$=angular deformation in torsion
$\sigma_p$=proportional limit
$\sigma_y$=elastic limit
$\tau$=shear stress
R=geometrical stiffness
$R_a$=actual geometrical stiffness
$R_o$=optimal geometrical stiffness
F=force as a general notion
D=deformation as a general notion
$C_s$=coefficient of elastic stability
K=coefficient which counts effect of specifics on geometrical stiffness
$F_m$=arithmetic mean value of distributed forces
$M_m$=arithmetic mean value of distributed moment
P=bending force

SUMMARY OF THE INVENTION

The invention is a new method of design load bearing structures. The method is based on a new theory of strength and elastic stability. According to this theory each structure has an individual limit of elasticity which depends on geometrical stiffness of the structure. Geometrical stiffness corresponding to the limit provides elastic stability. The new method is a process of designing the structure of predetermined optimal geometrical stiffness. Optimal geometrical stiffness can be calculated with new equation of elastic stability. This equation describes rate of change of deformation due to geometrical stiffness. The geometrical stiffness depends on correlation between cross-sectional and longitudinal dimensions, specific features of a structure and boundary conditions. In most of practical cases it is optimal cross-sectional characteristic which should be found. The method contains a nondestructive test in order to find coefficient 'K' which counts effect of specifics of a structure on geometrical stiffness. For similar structures coefficient 'K' is considered as the same. The method allows optimization of dimensions the series of similar structures by testing one representative structure.

The new method which is claimed comprises steps of evaluating forces distributed in the structure and estimating arithmetic mean value of said forces; measuring total deformation caused by these forces; determining actual geometrical stiffness of tested structure using data of mean value of forces and total deformation, $R_a=F_m/ED$; calculating optimal geometrical stiffness required by mean value of distributed forces with new equation of elastic stability, $R_o=(F_m/EC_s)^{0.5}$ where $C_s$ is a coefficient of elastic stability; comparing optimal geometrical stiffness with actual in order to exclude coefficient 'K' and to correct cross-sectional dimensions so that optimal geometrical stiffness is attained, $R_o/R_a=I_o/I_a$. It is the purpose of the new method to obtain necessary stiffness. However, the structure of optimal dimensions must be checked against limit of elasticity of material in order to choose the material correctly.

The new method is also directed to optimization series similar structures. Compare optimal geometrical stiffness of tested structure with optimal geometrical stiffness of similar structure using the equation describing stiffnesses one can calculate optimal dimension of similar structure, $R_o/R'_o=(I_o/I'_o)*(L'/L)$. The said method can be used with apparatus for measuring deformation in a structure, inputing the data in the computer for processing the information with a new program as described and displaying results. The method can be used for optimizing beams, plates, shells, cylinders, columns, shafts. Other details, uses and advantageous of this invention will become apparent as the following description of the examplary application of this method thereof presented.

DESCRIPTION OF ILLUSTRATED EXAMPLARY TEACHING

Figure 1:
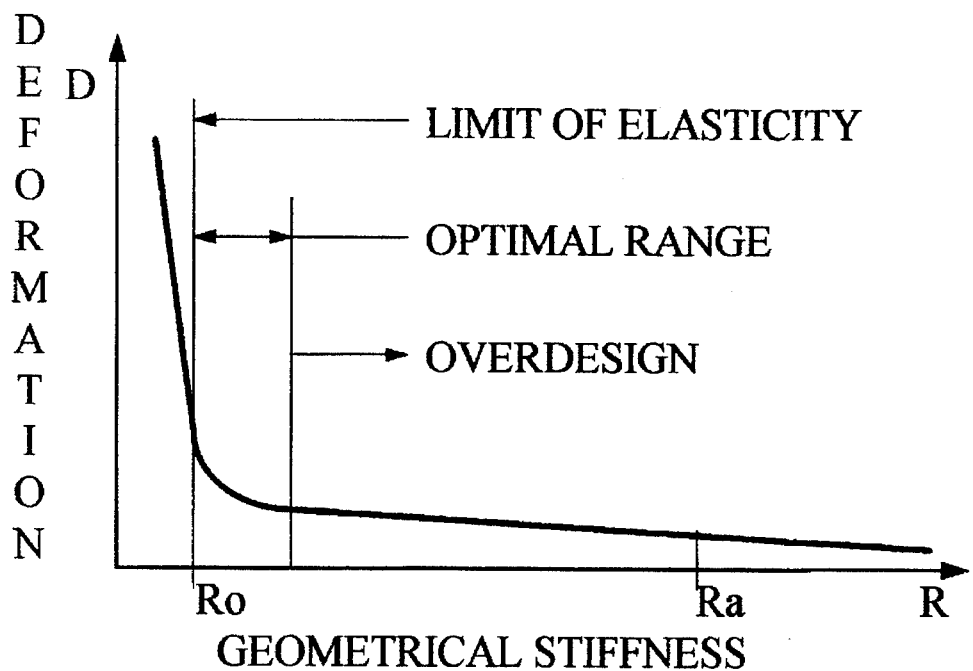
FIG. 1 is deformation versus geometrical stiffness diagram which shows change of deformation due to geometrical stiffness for the given force ($F_m$) and material (E). The tangent to the curve shows rate of change of deformation. Optimal geometrical stiffness ($R_o$) is chosen in the interval of rapid increase of deformation which indicates individual limit elasticity of a structure. Point $R_a$ on diagram shows position of an actual geometrical stiffness of the tested structure.
Figure 2:
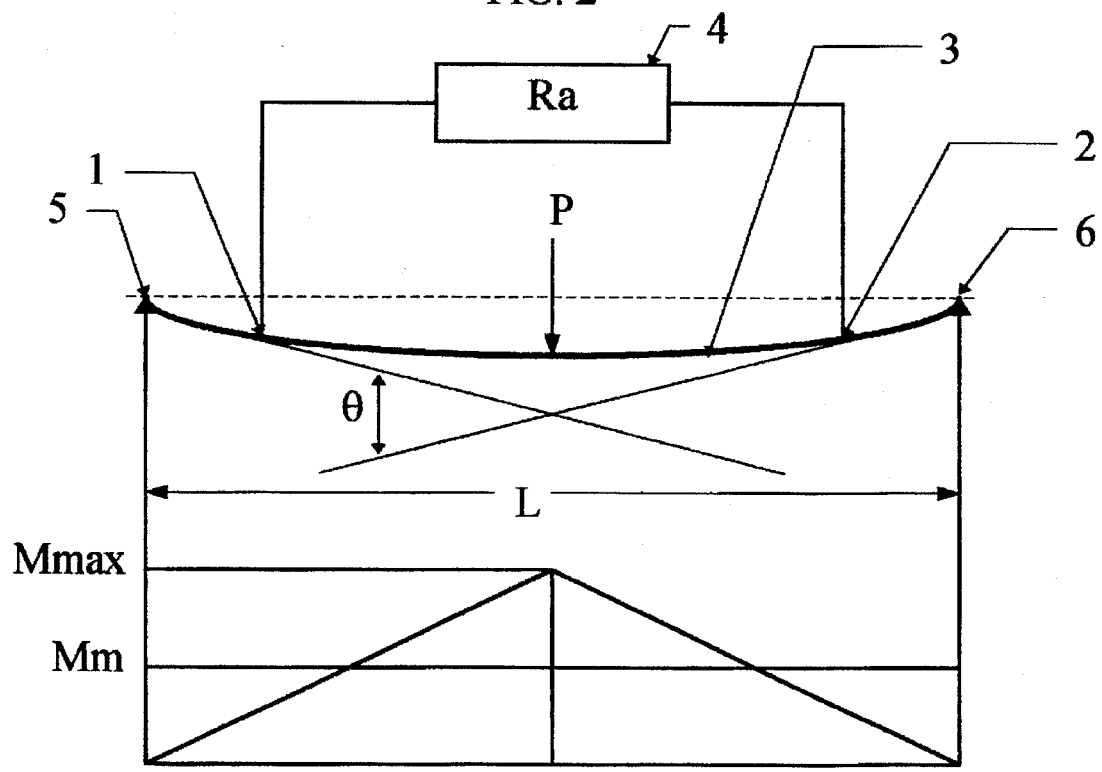
FIG. 2 is a simple beam 3 with concentrated force P at center. The strain gauges 1 and 2 are fixed at places close to the supports 5 and 6 and connected to the device 4 for measuring total deformation θ and calculating $R_a$ and $R_o$. The bending moment diagram in FIG. 3 shows distributed at length L bending moment, maximum bending moment $M_{max}$ and arithmetic mean value of distributed moments $M_m$.

Reference is now made to the drawing which illustrates an examplary teaching of said new method of and apparatus for optimization of structures. The said method is explained on the example of a simple beam with concentrated load at the center shown in FIG. 3. Strain gauges are fixed in the places 1 and 2 close to the supports of the beam 3 and connected to the apparatus 4. The apparatus has means for evaluating deformation, forces, geometrical stiffness. Said apparatus has also calculating device with a program and display.

Figure 3:
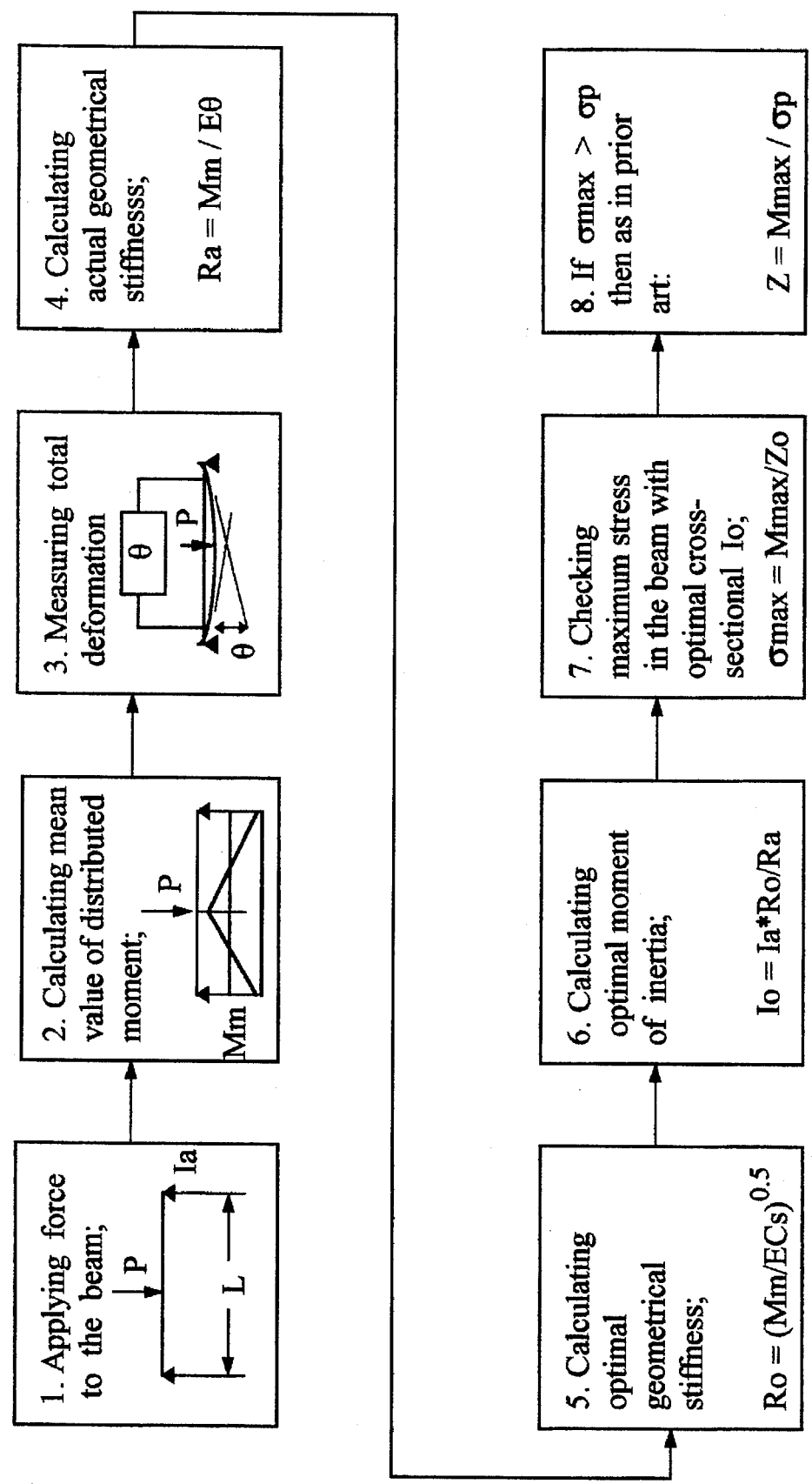
FIG. 3 is the diagram showing consequent steps of the process designing a simple beam as it in Description of Illustrated Examplary Teaching.

1. Dynamometric (known) force P causes distributed along the beam bending moment shown in the moment diagram. Maximum moment, $M_{max}=PL/4$.
2. Arithmetic mean value of distributed moment, $M_m=M_{max}/2$
3. Total angular deformation, $\theta_a=\alpha_1+\alpha_2$, shown in FIG. 3 is measured by means of a strain gauge device as a part of apparatus 4.
4. Actual geometrical stiffness of tested beam can be calculated using data obtained in the steps 2 and 3, $R_a=M_m/E\theta_a$.
5. Optimal stiffness can be calculated using an anticipated coefficient of elastic stability, $R_o=[M_m/EC_s]^{0.5}$.
6. Optimal moment of inertia of cross-section, $I_o=I_a*R_o/R_a$.
7. Maximum stress in the beam of optimal dimensions must be less than allowable by the material, $\sigma_{max}=M_{max}/Z_o \leq [\sigma_p]$.

In some more complex cases than this example force distributed in the structure is difficult to calculate. Then, following technic can be used:

1. Applying to the structure an additional dynamometric force, $P_d$.
2. Measuring total deformation from the dynamometric force, $\theta_d$.
3. Calculating arithmetic mean value of distributed in the structure moment, $M_d$.
4. Calculating geometrical stiffness of a beam, $R_a=M_d/E\theta_d$. Note, that actual stiffness of tested structure does not depend on the force applied to the structure. Greater force causes the proportionally greater deformation.
5. Measuring a deformation caused by actual external forces, $\theta_a$.
6. Calculating arithmetic mean value of distributed in the structure forces or moments caused by the external forces, $M_m=E*\theta_a*R_a$.
7. Calculating the optimal geometrical stiffness, $R_o=[M_m/E^C_s]^{0.5}$.
8. Calculating optimal cross-sectional dimensions, $I_o=I_a*R_o/R_a$.
9. Checking the maximum stress in the beam of optimal dimensions against elastic limit of material, $\sigma_{max}=M_{max}/Z_o \leq [\sigma_p]$.

Although, the test is simple it is unnecessary to repeat it in order to optimize similar structures. If the force in a similar structure is different then this force should be evaluated. The optimal stiffness of similar structure should be calculated, $R'_o=[M'_m/EC_s]^{0.5}$.

Optimal cross-sectional dimensions in the case of beam design, $I'=I_o*(L'/L)*(R'_o/R_o)$. where $R_o,I_o,L$ are the parameters of a tested beam, and $R'_o,I'_o,L'$ are the parameters of said similar beam.

Geometrical stiffness of a beam can be calculated using the equation of elastic deformation, $R_a=M_m/E\theta_a$. Or, geometrical stiffness can be measured by means of resistant element such as rheostat as a part of apparatus 4. Resistance of the rheostat is regulated accordingly to a value $M_m/E$ representing a standard of known $R_s*\theta_s$. Measuring total deformation in the beam its value then compared with the value of standard resistance. Geometrical stiffness, $R_a=R_s*\theta_s/\theta_a$.

The method described above on the example of a simple beam can be successfully used for any type of design. The more complex a structure the more beneficial the method. Fixing the strain gauges at some distance from each other at the structure and applying the known force total deformation can be measured and geometrical stiffness of this part of the structure as well. Force distributed in said part also can be measured by measuring strains. Then, optimal stiffness demanded by the force can be calculated. Geometrical stiffness of a structure can be corrected by changing one of geometrical parameters. Usually it is cross-section. For example, for the plates and shells geometrical stiffness can be corrected by correcting thickness, $t_o^3=t_a^3*R_o/R_a$. For the columns geometrical stiffness can be corrected by correcting cross-sectional area, $A_o=A_a*R_o/R_a$.

Obviously, many modifications and changes may be made to the forgoing description of the methods and apparatus without departing from the core of the invention. The material presented makes it clear fundamental difference between the prior art of design and a new art embodied in this invention. The new art considers an individual limit of a structure unknown in the prior art. The individual limit is described with the coefficient of elastic stability unknown as it is in the prior art. The individual limit of a structure depends on geometrical stiffness of a structure, the property as it is unknown in the prior art. Thus, the new methods of design are based on a new knowledge. The new methods are directed toward optimization of similar structures as well as optimization of an individual structure. There is no other method in the prior art which tries or can achieve this purpose. It is because the criteria of fixed limiting stress and fixed limiting deformation do not describe behavior of a structure and cannot be used for the purpose of optimization. The characteristic 'geometrical stiffness' is not developed in the prior art. It makes it impossible to compare the structures. Said new scientific methods allow to predict elastic failure of a structure and offer the shortest way of design the optimal structures.

What is claimed is:

1. The method of obtaining optimal cross-sectional characteristic of a design member using an apparatus for measuring deformation and calculating geometrical stiffness, said method comprising steps of:

(a) applying actual forces to a tested member;

(b) calculating mean value of distributed forces due to said forces;

(c) measuring total deformation due to said actual forces;

(d) calculating an actual geometrical stiffness of a member using data of said mean value of distributed forces as in step (b) and said deformation as in step (c);

(e) calculating optimal geometrical stiffness of a member required by said mean value of forces as in step (b);

(f) calculating optimal cross-sectional characteristic of a design member by correcting cross-sectional characteristic of a tested member using the ratio of said optimal geometrical stiffness as in step (e) to said actual geometrical stiffness as in step (d), particularly:

(A) determining optimal moment of inertia of a beam by correcting actual moment of inertia of a tested beam using the ratio of said optimal geometrical stiffness as in step (e) to said actual geometrical stiffness as in step (d);

(B) determining optimal cross-sectional area of a column by correcting actual cross-sectional area of tested column using the ratio of said optimal geometrical stiffness as in step (e) to said actual geometrical stiffness as in step (d);

(g) approving a design of optimal cross-sectional characteristic as in step (f) by checking maximum stress in said optimal design against proportional limit of the material.

2. The method of obtaining mean value of forces distributed in a member using an apparatus for measuring deformation and calculating geometrical stiffness, said method comprising steps of:

(a) applying a single force of known value to the tested member;

(b) calculating mean value of distributed forces due to said single force;

(c) measuring total deformation due to said single force;

(d) calculating an actual geometrical stiffness of a member using data of said mean value of distributed forces as in step (b) and said deformation as in step (c);

(e) removing said single force;

(f) applying actual forces to be evaluated to said member;

(g) measuring total deformation due to said actual forces;

(h) calculating mean value of said actual distributed in a member forces using data of said total deformation as in step (g) and data of actual geometrical stiffness as in step (d).

3. An apparatus for measuring total deformation and having computing device with a program for calculating actual geometrical stiffness and optimal geometrical stiffness, said apparatus comprising means of:

(a) deformation measuring device for measuring total deformation between two points on a member;

(b) calculating device having means:

(A) means for entering data of said deformation as in step (a), data of applied forces and modulus of material cross-sectional characteristics, longitudinal dimensions, limiting stress of material;

(B) a program for processing said data of deformation, forces, geometrical parameters, e.g., cross-sectional characteristics, longitudinal dimensions, modulus of elasticity of material, material's limiting stress and calculating mean value of distributed forces, actual geometrical stiffness, optimal geometrical stiffness, optimal cross-sectional characteristics, maximum stresses;

(C) display for showing at least said actual geometrical stiffness and said optimal geometrical stiffness.

* * * * *